(12) United States Patent
Alagna et al.

(10) Patent No.: US 12,174,252 B2
(45) Date of Patent: Dec. 24, 2024

(54) CIRCUIT ARRANGEMENT FOR VALIDATION OF OPERATION OF A LOGIC MODULE IN A MULTIPOWER LOGIC ARCHITECTURE AND CORRESPONDING VALIDATION METHOD

(71) Applicant: STMICROELECTRONICS S.r.l., Agrate Brianza (IT)

(72) Inventors: Diego Alagna, Milan (IT); Alessandro Cannone, Rho (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 28 days.

(21) Appl. No.: 18/324,583

(22) Filed: May 26, 2023

(65) Prior Publication Data

US 2023/0393198 A1    Dec. 7, 2023

(30) Foreign Application Priority Data

Jun. 7, 2022    (IT) ......................... 102022000012056

(51) Int. Cl.
 *G01R 31/3177*    (2006.01)
 *G01R 31/317*    (2006.01)
 *G06F 1/08*    (2006.01)

(52) U.S. Cl.
 CPC ... *G01R 31/3177* (2013.01); *G01R 31/31725* (2013.01); *G06F 1/08* (2013.01)

(58) Field of Classification Search
 CPC .. G01R 31/3177; G01R 31/31725; G06F 1/08
 See application file for complete search history.

(56) References Cited

U.S. PATENT DOCUMENTS

| | | |
|---|---|---|
| 2011/0221502 A1 | 9/2011 | Meijer et al. |
| 2015/0186113 A1 | 7/2015 | Skoglund et al. |
| 2015/0303900 A1 | 10/2015 | Wang et al. |
| 2020/0132762 A1 | 4/2020 | Kukreja et al. |
| 2023/0393198 A1* | 12/2023 | Alagna ............ G01R 31/31712 |

* cited by examiner

*Primary Examiner* — Samir W Rizk
(74) *Attorney, Agent, or Firm* — Seed IP Law Group LLP

(57) ABSTRACT

A first circuit is coupled to a second circuit via a communication link. The first circuit generates a first validation signal, a second validation signal, and control signals, and transmits the first and second validation signals to the second circuit via the communication link. The second circuit validates the control signals based on the first and second binary validation signals. The validating includes: verifying that when the first validation signal has a first value, the second validation signal has a second value different from the first value; verifying that when the second validation signal has the first value, the first validation signal has the second value; verifying detection of a transition edge of the first validation signal within a threshold number of clock cycles; and verifying detection of a transition edge of the second validation signal within the threshold number of clock cycles.

29 Claims, 6 Drawing Sheets

CIRCUIT ARRANGEMENT FOR VALIDATION OF OPERATION OF A LOGIC MODULE IN A MULTIPOWER LOGIC ARCHITECTURE AND CORRESPONDING VALIDATION METHOD

BACKGROUND

Technical Field

Embodiments of the present disclosure relate to solutions for validation of operation of a logic module in a multipower logic architecture.

Embodiments of the present disclosure relate in particular to ICs (Integrated Circuits), in particular for automotive application, specifically multi-power logic architectures for low power consumption.

Description of the Related Art

Automotive integrated circuits which are present in a vehicle are usually power supplied, directly or indirectly, from the car battery. The current consumption is becoming one of the main concerns of automotive applications because of the increasing presence of integrated circuits in the car and the spread of electric vehicles where battery charge cannot be wasted. The required low power consumption during a standby phase of devices usually leads to multi-power solutions for the integrated circuits.

In multi-power domains there are two or multiple logic blocks, e.g., the power domains, each with its own supply and oscillator.

The oscillator of a standby logic domain, for instance, can be slower than the main logic domain one because the device may have a low power consumption.

The standby logic is in control of power-up and power-down of the main logic.

Standby and main logic communicate one with the other through several signals depending on the functions they have to execute.

A validation signal, which declares valid the signals of the main logic for instance, has to take in account several conditions: if the main supply is available, if no fatal fault present in main logic, if the main oscillator is toggling, etc.

A solution known in the art for validation of operation of a logic module in a multipower logic architecture is based on the level of a single wire signal depending on the main supply logic to validate a 'GOOD' or 'BAD' condition on the main logic. This solution is very simple, has low implementation cost and low latency. This solution is however not reliable in case of stuck-at fault on this wire, because it would lead to consider the main signals always valid or not valid. This solution also does not cover a single point fault on the line and does not take in account other faults than power supply.

Another known solution is based on the period of a single wire signal to validate a 'GOOD' or 'BAD' condition on the main logic. If the period of validation signal is inside some time limits (e.g., minimum time Tmin and maximum time Tmax), the condition of main logic is considered GOOD. This solution covers the stuck-at condition because a toggle of the signal is required. It has higher implementation cost than the first one. However, this solution is dependent on the standby oscillator because the standby logic detects a correct or wrong period. Time limits Tmin and Tmax decided during the main logic design phase depend on the standby oscillator characteristics, and this leads to make the validation process standby-dependent. A major drawback of this implementation is the latency required to detect a fault condition. This latency strongly depends on the standby oscillator, which may toggle at low frequency due to power consumption constraints.

BRIEF SUMMARY

In an embodiment, a system comprises a first logic circuit having a first clock input and a first power input, a second logic circuit having a second clock input and a second power input, and a communication link communicatively coupling the first logic circuit and the second logic circuit. The first logic circuit, in operation, generates a first binary validation signal, a second binary validation signal, and one or more control signals, and transmits the first binary validation signal and the second binary validation signal to the second logic circuit via the communication link. The second logic circuit, in operation, validates the one or more control signals generated by the first logic circuit based on the first binary validation signal and the second binary validation signal. The validating the one or more control signals comprises: verifying that when the first binary validation signal has a first value, the second binary validation signal has a second value different from the first value; verifying that when the second binary validation signal has the first value, the first binary validation signal has the second value; verifying detection of a transition edge of the first binary validation signal within a threshold number of clock cycles; and verifying detection of a transition edge of the second binary validation signal within the threshold number of clock cycles.

In an embodiment, a method comprises: generating, using a first logic circuit, a first binary validation signal, a second binary validation signal, and one or more control signals; transmitting, by the first logic circuit via a communication link, the first binary validation signal and the second binary validation signal to a second logic circuit; and validating, by the second logic circuit, the one or more control signals generated by the first logic circuit based on the first binary validation signal and the second binary validation signal received via the communication link. The validating the one or more control signals comprises: verifying that when the first binary validation signal has a first value, the second binary validation signal has a second value different from the first value; verifying that when the second binary validation signal has the first value, the first binary validation signal has the second value; verifying detection of a transition edge of the first binary validation signal within a threshold number of clock cycles; and verifying detection of a transition edge of the second binary validation signal within the threshold number of clock cycles.

In an embodiment, a device comprises an interface, which, in operation, receives a first periodic binary validation signal and a second periodic binary validation signal via a communication link, and logic circuitry coupled to the interface. The logic circuitry, in operation, validates one or more control signals based on the first periodic binary validation signal and the second periodic binary validation signal, wherein the validating the one or more control signals comprises: verifying the first periodic binary validation signal has a first value when the second periodic binary validation signal has a second value different from the first value; verifying the second periodic binary validation signal has the first value when the first periodic binary validation signal has the second value; verifying detection of a transition edge of the first periodic binary validation signal within a threshold number of clock cycles; and verifying detection of a transition edge of the second periodic binary validation signal within the threshold number of clock cycles.

In an embodiment, a device comprises a communication interface; a clock, which, in operation, generates a clock signal; and logic circuitry coupled to the clock and to the communication interface. The logic circuitry, in operation, generates one or more control signals, generates a first periodic binary validation signal associated with the one or more control signals, and generates a second periodic binary validation signal associated with the one or more control signals. The logic circuitry transmits the first periodic binary validation signal and the second periodic binary validation signal via the interface. In a normal mode of operation, the first periodic binary validation signal has a first value when the second periodic binary validation signal has a second value different from the first value, and the second periodic binary validation signal has the first value when the first periodic binary validation signal has the second value.

BRIEF DESCRIPTION OF THE SEVERAL VIEWS OF THE DRAWINGS

Embodiments of the present disclosure will now be described with reference to the annexed drawings, which are provided purely by way of non-limiting example and in which.

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figures parts, elements or components which have already been described with reference to previous Figures are denoted by the same references previously used in such Figures; the description of such previously described elements will not be repeated in the following in order not to overburden the present detailed description.

In an embodiment, the solution here described is based on sending two signals on two wires, such signals toggling a specific pattern in time to validate a GOOD or PASS condition, e.g., the logic module is operating correctly, and a BAD condition or FAIL condition, e.g., the logic module is not operating correctly, on a logic module which sends the two signals. Another logic module receives the two signals and performs checks to perform the validation of the operation, e.g., to declare the operation correct (valid) or not.

Figure 1:
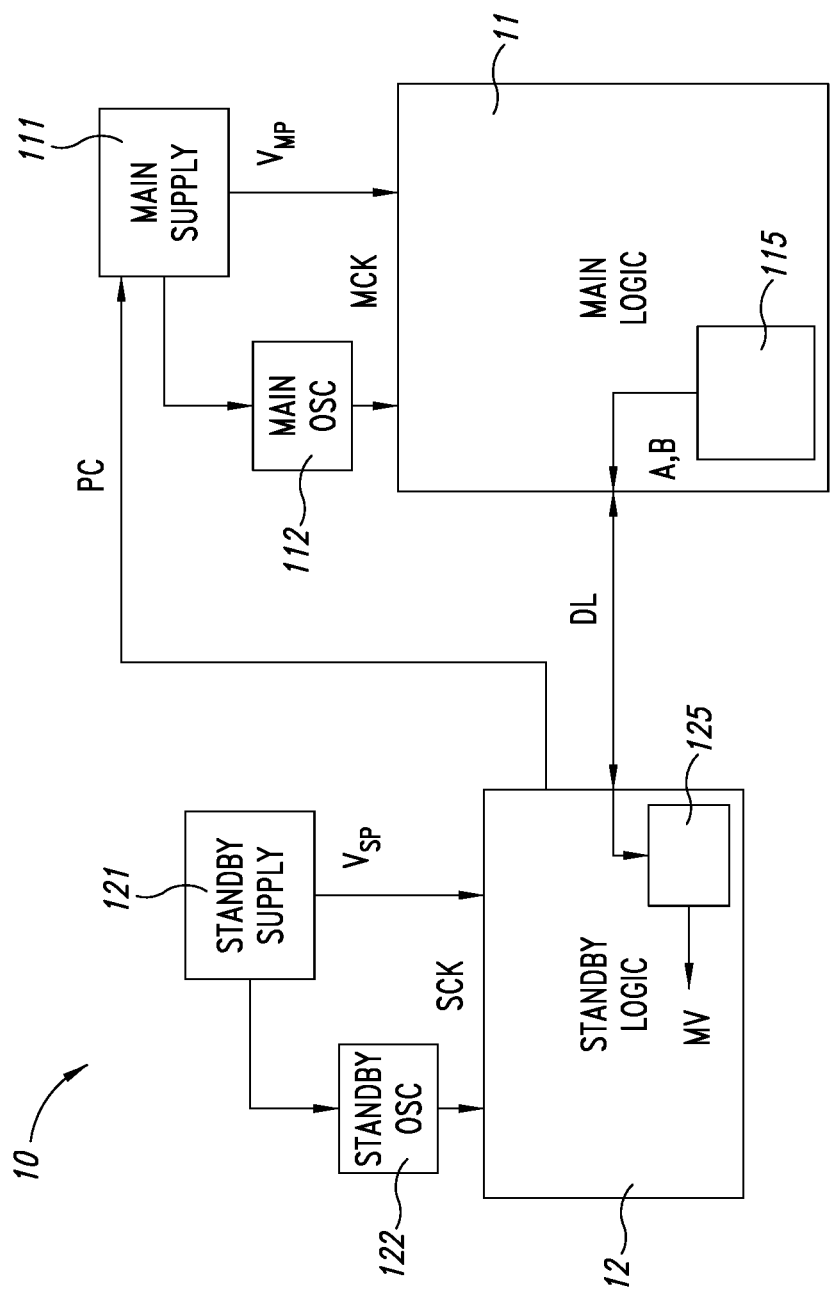
FIG. 1 shows schematically a circuit arrangement according to an embodiment.

To this regard, in FIG. 1 it is shown schematically a multipower logic architecture, indicate as a whole with the numerical reference 10, which comprises a main logic module 11 and a standby logic module 12.

The main logic 11 comprises a main supply 111 which supplies a main power supply $V_{MP}$ to the main logic 11 and to a main oscillator 112, which in its turn supplies a main clock signal MCK to the main logic 11. The main logic 11, in operation, generates signals, such as control signals.

The standby logic 12 comprises a standby supply 121 which supplies a standby power supply $V_{SP}$ to the standby logic 12 and to a standby oscillator 122, which in its turn supplies a standby clock signal SCK to the standby logic 12. The standby logic 12 is configured to issue a power control signal PC to the main supply 111 of the main logic 11 to power it up and down. The standby logic 12 and the main logic 11 exchange signals on a communication link DL.

The standby clock signal SCK typically operates at a clock frequency lower than the frequency of the main clock signal MCK, for instance in a range from ten to thousand times lower than the main clock signal MCK. This to reduce consumption. However, in variant embodiments, in particular not concerned with reducing power consumption, the frequency of the clock MCK of the first module 11 and SCK of then second module 12 may be the same, in particular they may share the same clock.

The standby logic 12 has to know when the signals (e.g., control signals, etc.) coming from the main logic 11 over a communication link DL are correct and stable and therefore the standby logic 12 needs to validate such signals to avoid to execute unwanted operations. The communication link DL is representative of means for exchanging signals between the main logic 11 and the standby logic 12, and may be embodied by a single wire, e.g., a bus, or multiple wires, which can be coupled to different interfaces. Also, the physical channel may be implemented by wires or be wireless.

Thus, the main logic 11 comprise a validation signal generator 115 which generates a first validation signal A and a second validation signal B, for example, over two separate wires or channels, which are sent, for instance over the communication link DL, to the standby logic 12, which comprises a checking module 125 configured to issue on the basis of said first validation signal A and a second validation signal B, a check result signal MV, which indicates if the main logic 11 is sending valid signals or not. Of course, the check result signal MV validates signals issued by the main logic 11 to the exception of the first validation signal A and of the second validation signal B.

Figure 2:
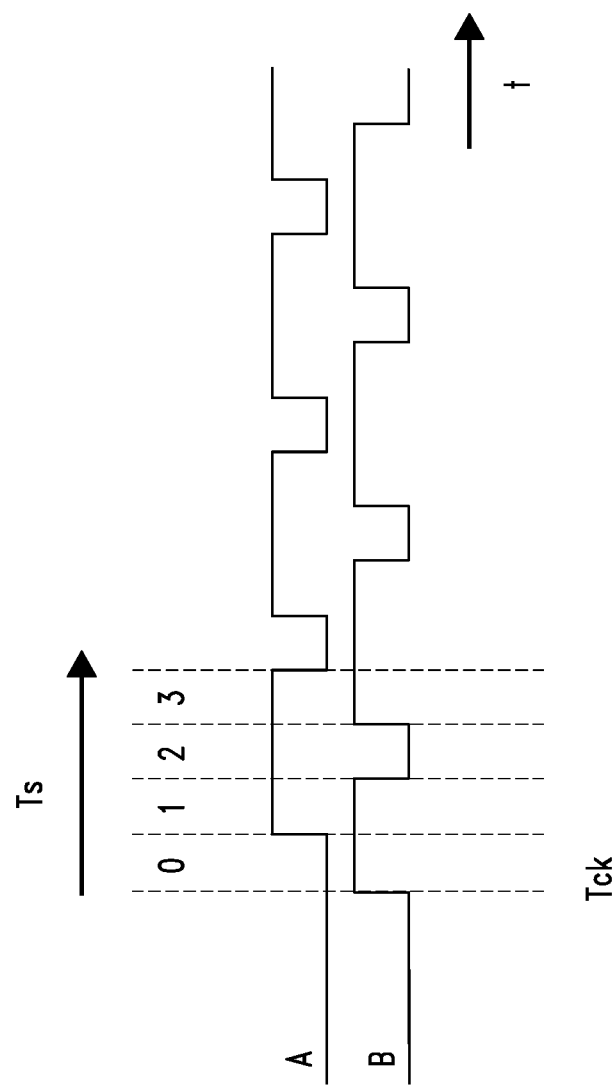
FIG. 2 shows a time diagram of signals generated by the circuit arrangement according to an embodiment.

As shown in FIG. 2, a time diagram is represented showing the first validation signal indicated with the reference A, and the second validation signal indicated with the reference B. The first validation signal A and second validation signal B have a signal period Ts, which in the examples shown is of four cycle periods, or clock periods, Tck. Tck is the clock period of the main clock signal MCK. The signal period Ts may be any integer multiple of period Tck, in the example here shown is 4*Tck. Thus, the first validation signal A and second validation signal B may also be generated slowly (Ts multiple of four clock periods) if required, for example in case the communication link does not allow very fast communications. In each cycle period Tck the first and second validation signal A, B assume a respective logic value, logic one or high logic value and logic zero or low logic value.

According to an embodiment of the solution here described, the values of said first validation signal A and second validation signal B are never zero at the same time, e.g., their Hamming distance is always one, when one of such validation signals A, B is zero, as it could happen during a supply drop or reset assertion. Also, a zero logic value in each of the first validation signal A and second validation signal B is preceded and followed by a logic one, this in order to avoid any overlap of zero condition on both signals.

By way of example, as shown in FIG. 2, first validation signal A and second validation signal B can have the following values:

First validation signal A→0 1 1 1
Second validation signal B→1 1 0 1

The validation is executed in three steps:
check that the second validation signal B is always 1 when the first validation signal A equal to 0,
check that the first validation signal A is always 1 when Second validation signal equal to 0, and
cyclic check that the first validation signal A or second validation signal B are not stuck-at-1.

Thus a first logic module in a multipower architecture like the one described in FIG. 1, e.g., the main logic module 11, is configured to generate, by the validation signal generating module 115, the first validation signal A and second validation signal B on a first and second wire respectively, which are sent over the communication link, e.g., DL, to the second logic, e.g., the standby logic 12, the values of such first validation signal A and second validation signal B being never zero at the same time and a zero value in each of the first validation signal A and second validation signal B being preceded and followed by a logic one.

The second logic, e.g., standby logic 12 is then configured, e.g., by the detection module 125, to:
perform a first check that the second validation signal is always logic one when the first validation signal is zero,
perform a second check that the first validation signal is always logic one when the second validation signal is zero,
perform a cyclic check that the first validation signal and the second validation signal are not stuck-at-1.

The solution here described thus provides a circuit arrangement which validates operation of the first logic if said first, second and cyclic check give each a positive result, in particular issuing an operation valid signal MV which values can indicate success (or GOOD or PASS), e.g., correct operation, or failure (or BAD or FAIL), e.g., incorrect operation.

Figure 3:
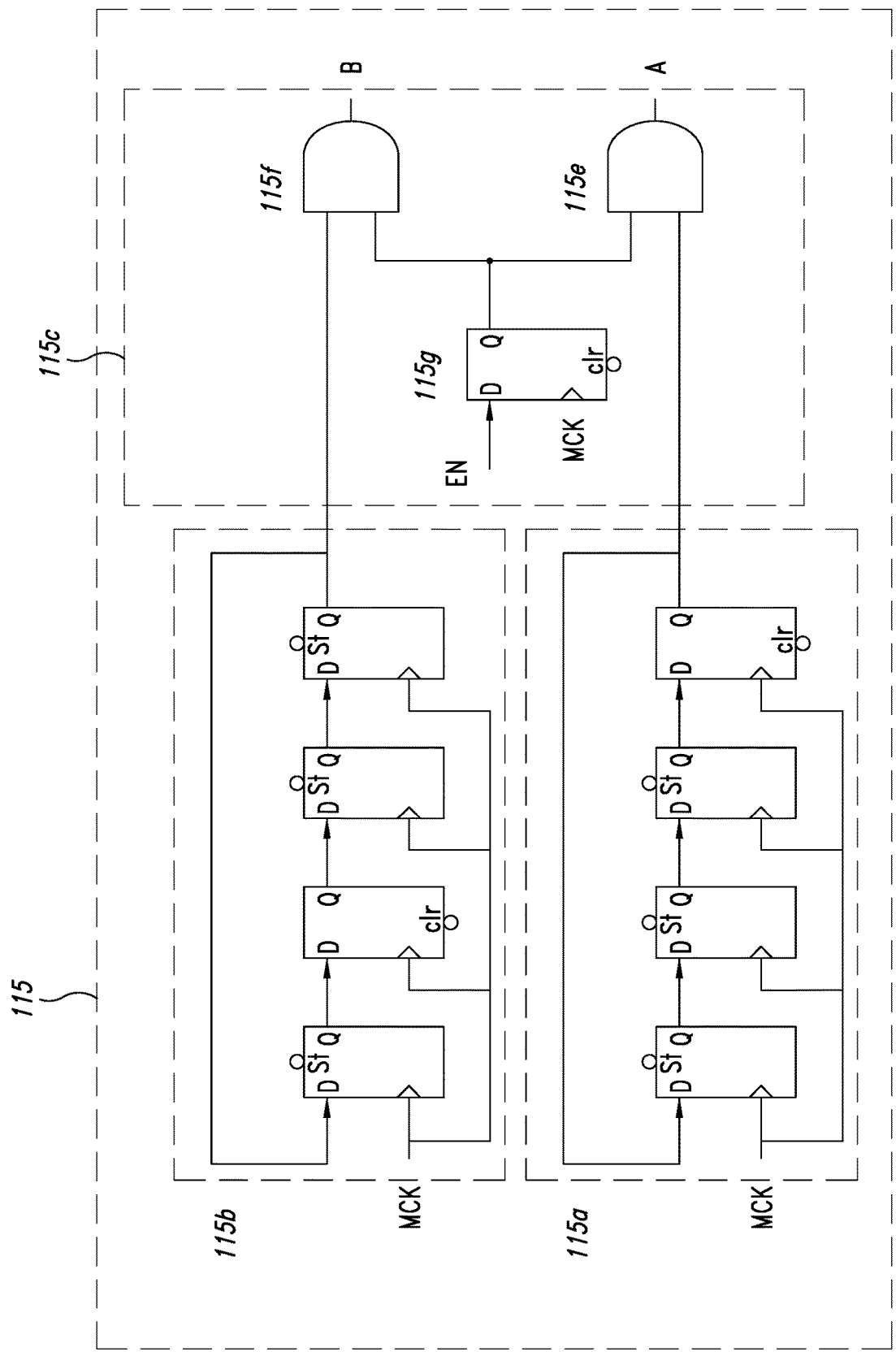
FIG. 3 shows the circuit diagram of a first module of the circuit arrangement according to an embodiment.

In FIG. 3 it is shown to this regard an implementation of the validation signal generating module 115 performing the generation of the validation signals A and B, which is comprised in the main logic module 11.

Ideally, the main logic 11 sends out the correct validation signals A and B to the standby logic 12.

As shown in FIG. 3, in embodiments the validation signal generating module 115 may thus comprise two linear feedback shift registers, 115a and 115b, the first 115a configured to generate the first validation signal A, in particular in the example shown the sequence 0111 and the second configured to generate the second validation signal B, in particular in the example shown, the sequence 1101. Each of the two linear feedback shift registers, 115a and 115b comprises a chain of four cells, in the example embodied by D-Flip Flops with asynchronous set or clear, one for each bit of the validation signals A, B and has the output of the last cell clocked by the main clock signal MCK, fed back directly to the first cell data input.

In the first linear feedback shift register, 115a, the fourth and last cell in order has negated set and reset inputs with respect to the others while in the second linear feedback shift register, 115b, the third cell in order has negated set and reset inputs with respect to the others.

Thus, the chain of cells, in this example, Flip Flops, is in charge of generating validation signals A and B. The simplest and immediate way to generate a sequence of value is to force a value inside a flip-flop chain and shift the value of the flip-flops in the chain. The last Flip Flop is then coupled to the first one to create a loop and generate the sequence continuously.

All ports of the flip-flops composing the chain indicated with set (St) and clear (clr) are coupled to the same source signal which is usually a common reset (e.g., power-on-reset PR). The difference between the signal received at set St and clear clr input or port of the flip flops of the chains, is that signal at set St at logic zero forces the output of the flip-flop to logic one, while at clear clr forces the output of the flip-flop to logic zero. Both have effect on the output asynchronously.

The validation signal generating module 115 comprises then a logic output stage 115c, as illustrated, a logic circuit which comprising two branches to which said first validation signal A and second validation signal B being are respectively brought, said logic output stage 115c being configured to issue the first validation signal A and second validation signal B, e.g., releasing such signals on the communication link DL, upon reception of an enabling command, EN. In the example, the logic output stage 115 comprises an AND gate on each branch, 115e, 115f, which receive at one input the first validation signal A and second validation signal B respectively and at the other input the enabling command EN. In particular, in the example, the enabling command EN is received and forwarded to the logic output stage 115 by a further flip-flop 115g, clocked by the main clock signal MCK.

Figure 4:
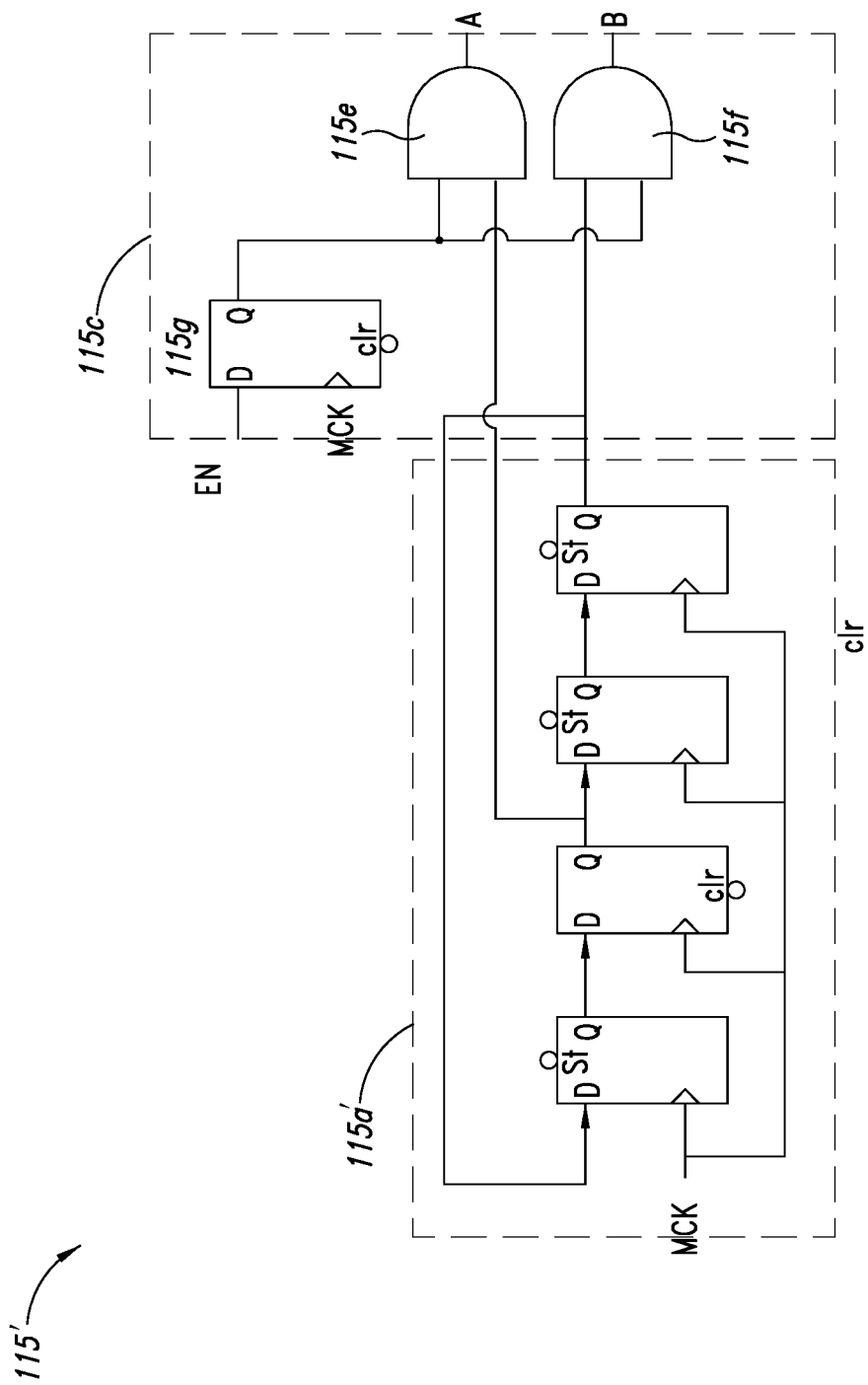
FIG. 4 shows the circuit diagram of a variant of the first module of the circuit arrangement according to an embodiment.

In FIG. 4 it is shown a second embodiment 115' of the validation signal generating module in which a single LFSR register 115'a is used. While in the embodiment 115 the first validation signal A and second validation signal B are taken at the output of the last cell of each register 115a and 115b respectively, in the embodiment 115' the first validation signal A and second validation signal B are taken at the output of the last cell of the respective register and at the output of one of the preceding cells, in particular the second, of said single register 115'a. In the single linear feedback shift register, 115'a, the third cell in order has negated set and reset inputs with respect to the others. The output stage 115c corresponds to that shown in FIG. 3.

In FIGS. 3 and 4 are shown examples of the implementation of the validation signal generating module 115 configured to generate the first and validation signal, which are particularly simple, but it is clear that the person skilled in the art of designing logic circuits may design differently the arrangement shift registers or also design an entirely different arrangement to obtain a generator of the values of such first validation signal A and second validation signal B which are never zero at the same time and where a zero value in each of the first validation signal A and second validation signal B being preceded and followed by a logic one. For instance, the signal generating module may be obtained with a counter and threshold check.

Also, the first validation signal A equal to 0 1 1 1 over the signal period Ts and the second validation signal B equal to 1 1 0 1 over the signal period Ts are only an example of sequences implementing the above rules, e.g., never zero at the same time and where a zero value is preceded and followed by a logic one. Thus, for instance the first validation signal A may be 0101 and second signal B may be 1010. Also, the pattern of each validation signals may have more bits than 4 or less, for instance three bits, pattern such 011-110 or 010-101. Having not consecutive zero helps avoid that, due to some delay misalignment, the zeros of signals A and B overlap. Having longer pattern with a greater distance between the zeroes may be of course safer in order to avoid overlap due to delay misalignment. Also, patterns of two bits, e.g., 01 and 10 may embody the validation signal, as in the previous three bit, the problem would be that any small delay misalignment would represent a potential source of errors in the validation operation. However, it is here indicated that in case signals with no delay misalignment were provide, e.g., no risk or very small risk of zero overlap, two bit and three-bit patterns may be considered within the scope of the solution here described. Thus the method here described in embodiments may be directed also to a first logic module configured to generate a first validation signal A and a second validation signal B, in particular on a first and second wire respectively, which are sent over the communication link DL to the second logic module 12, the values of said first validation signal A and second validation signal B being never zero at the same time, said first validation signal A and second validation signal B comprising each at least two bits. In some embodiments, said first validation signal A and second validation signal B comprise each at least three bits. In embodiments, said first validation signal A and second validation signal B comprise each at least four bits.

It is also possible to add a plurality of cycles of '1' in both signals without any problem but in this case the time for check stuck-at-1 increases. By way of example, using A=011111 B=110111, e.g., two ones are added after each signal A, B of the exemplary embodiment. The relevant aspect is that when one validation signal A (or B) is zero the other B (or A) is always one.

It is then underlined that in embodiments it may be that the first validation signal A and second validation signal B which are never zero at the same time, however more than a zero value, e.g., two zero values or three zero values, are arranged consecutive between logic ones, e.g., in each of the first validation signal A and second validation signal B a sequence of two or more zero values is preceded and followed by a logic one. Also, the first validation signal A and second validation signal B may have a different number of consecutive zeros, e.g., first signal A one zero, second signal B three zeros. These variant embodiments may be applicable although the solution where a zero value in each of the first validation signal A and second validation signal B is preceded and followed by a logic one should give advantages in term of speed of the operation.

Figure 5:
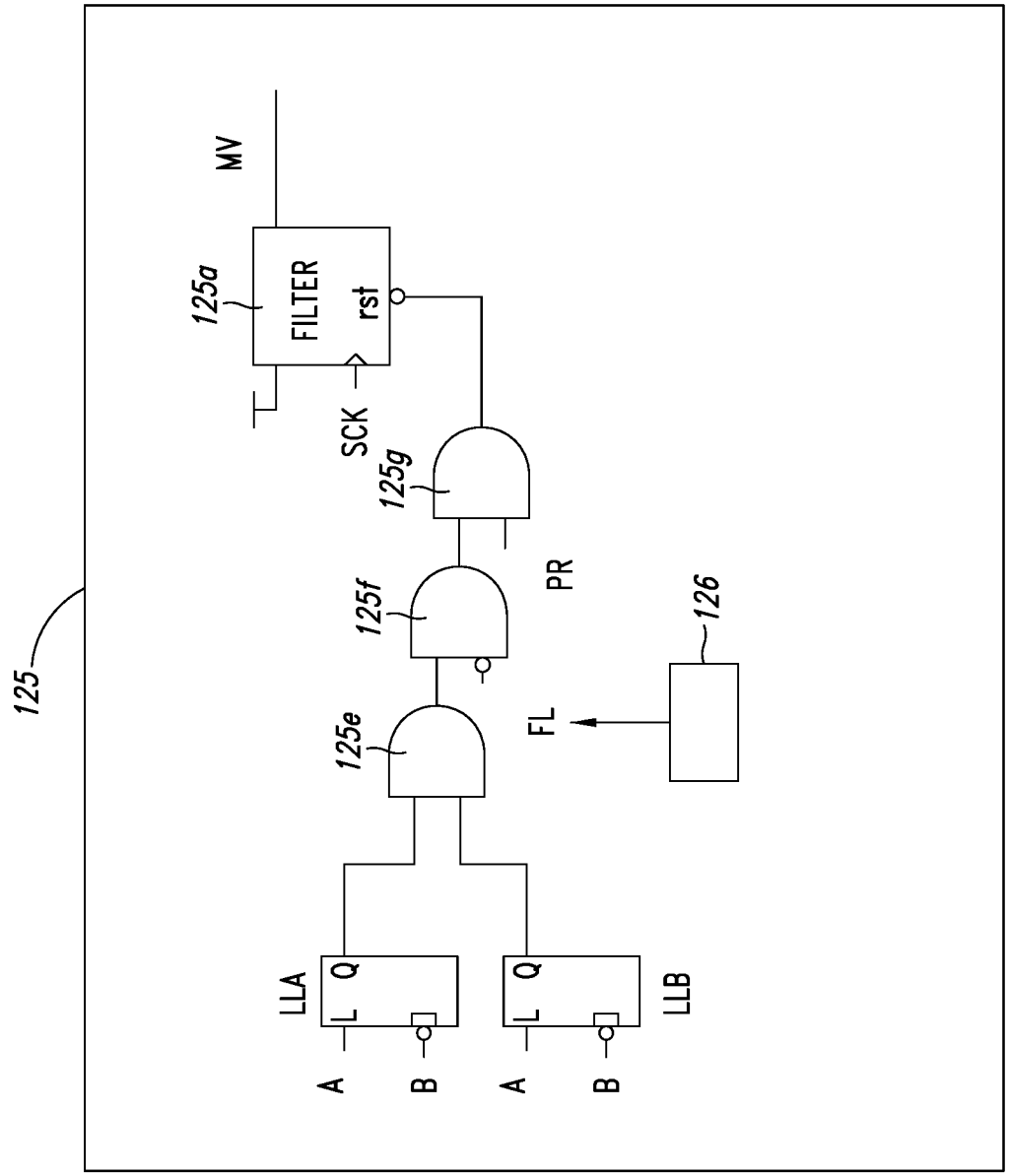
FIG. 5 shows the circuit diagram of a second module of the circuit arrangement according to an embodiment.

In FIG. 5 is shown an implementation of the checking module 125, which is configured to detect if the correct level of first validation signal A and second validation signal B is received, when one of the two signals is at zero level and to correspondingly generate an operation valid signal MV indicating if the result of the validation of the operation main logic 11 is good or not. The checking module 125, as shown, is included in the standby logic 12 and receives the first validation signal A and second validation signal B, for instance over the link DL.

The checking module 125 comprises a delay circuit, in the example implemented as digital filter 125a, clocked by the second clock signal, e.g., standby clock signal SCK, configured to delay the check result signal MV of one or more second clock signal SCK cycles. The digital filter 125a may be embodied by a counter arrangement, which includes, as known, a plurality of flip flops, e.g., a synchronous up counter, that outputs a high logic value once the counter reaches its final threshold. It can be considered as a circuit applying a digital delay of some clock cycles (determined by the threshold of the counter) of the standby clock signal SCK in order to let the check result signal MV stabilize, e.g., to apply a settling time. Since the clock signal SCK is much slower than the main clock signal MCK also one clock cycle of delay may suffice. Of course, if the standby clock signal SCK and the main clock signal MCK have similar frequencies, a higher number of cycles of delay may be applied, to obtain the desired settling time. At its output is taken the check result signal MV, which, as said, goes to high logic value after a number of clock cycles (determined by the threshold of the counter, e.g., the delay of the circuit) of the standby clock signal SCK and can be reset by a filter reset signal rest (to low logic value, resetting in particular the counter), e.g., upon activation, in the example logic one, the filter reset signal rst restarts to apply the one or more second clock signal cycles set as delay, e.g., counter threshold, to the check result signal MV.

The first validation signal A and second validation signal B are sent to the data inputs of a first and second latch LLA and LLB, each clocked by the respective other validation signal, the output of each latch LLA, LLB is then supplied to a first AND circuit 125e, e.g., a circuit performing the logic function AND, either by a single gate, two input AND gate as shown, or by a different logic circuit arrangement, which checks if the first signal A is at logic one while the second signal B is at logic zero and vice versa, performing the first and second check. If one or both the checks fail the output of the AND gate 125e is zero, if both the checks are good, e.g., logic one, the output of the AND gate 125e is raised (to logic one). Then the output of the first AND circuit 125e is brought to a second AND circuit 125f, which receives the negated of a flag signal FL from a stuck at-1 checker module 126, shown in FIG. 6, which performs the cyclic check. If the flag signal FL is raised, e.g., set to logic one, it means that there is a fail in check stuck-at-1, the corresponding negated input is zero, the output of the second AND circuit 125f is low. Then the output of the second AND circuit 125f is brought to a third AND circuit 125g together with a power on reset signal PR, e.g., a signal indicating if a power on reset is performed, the output of which is brought to a filter reset rst input of the digital filter 125a. If a power on reset is performed, reset signal PR is in the example set to zero, which indicates a reset condition. The output of the third AND circuit 125g is zero, which means that filter reset rst input is set a zero, which correspond to reset the filter

125a (e.g., reset active), e.g., resetting the counter in the digital filter 125a. As mentioned, when flag signal FL=1, the output of AND circuit 125f is zero, the output of the AND circuit 125g is 0, which also means that the filter reset rst input is set a zero, resetting the digital filter 125a. Thus, the digital filter 125a or counter is reset (e.g., rst=0) in case the output of the third AND circuit 125g indicates a fault condition, because either 125e (not both LLA, LLB outputs at 1) or 125f (FL=1) outputs indicated a fault condition or because the power on reset signal PR is set to zero (PR=0). In this case, upon the filter reset rst, the operation valid signal MV is low, e.g., indicates that the signals of the main logic 11 are not valid. If no fault is present, the digital filter 125a waits the filter time, e.g., the number of clock cycles of the clock SCK set by its counter threshold, before raising the check result signal MV, indicating that the main logic 11 is valid, e.g., sends valid signals.

Figure 6:
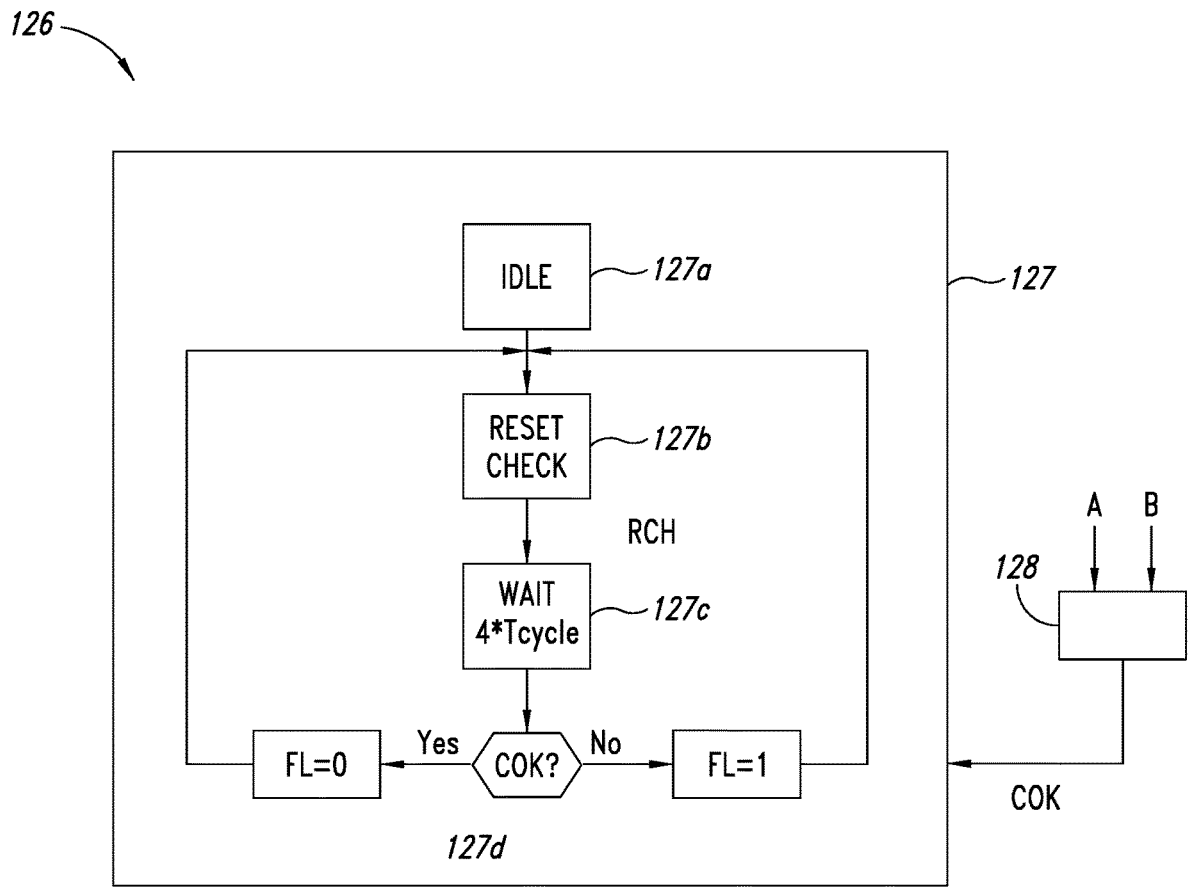
FIG. 6 shows a detailed diagram of the second module of the circuit arrangement according to an embodiment.

In FIG. 6 it is shown schematically the stuck-at-1 checker 126 which comprises two blocks: a control module 127 and a datapath module 128.

The control module 127 is a logic module which in FIG. 5 is represented by block comprising a flow diagram of its operations, e.g., the block 127 is configured to perform such operations. Thus, the control module 127 is configured to start in an idle state 127a and, when the main validation starts, in a step 127b is configured to release a reset checks signal RCH. Then, the control module 127 is configured to wait 127c for at least four clock periods, 4*Tc, e.g., the signal period Ts, and then to verify 127d the value of a stuck at-1 check okay signal COK issued by the datapath module 128 on the basis of the validation signals A and B, as better shown with reference to FIG. 6. In embodiments, the control module 127 may be configured to wait 127c for only one clock period. The status of datapath module 128 flip-flops is cleared before the check is performed.

If the verification step 127d gives positive result, e.g., the check ok signal COK indicates that the cyclic check performed in the datapath module 128 is ok, e.g., is passed, e.g., is logic one, a FAIL status flag FL is cleared, e.g., set to zero, and check restarts, e.g., control is returned to step 127b.

If the verification step 127d gives negative result, e.g., the stuck at-1 check okay signal COK indicates that the cyclic check performed in the datapath module 128 is not ok, e.g., has failed, the FAIL status flag FL is set, e.g., raised to logic one, and check restarts, e.g., control is returned to step 127b. The flag FL remains set until a check OK signal COK with positive result is detected.

Figure 7:
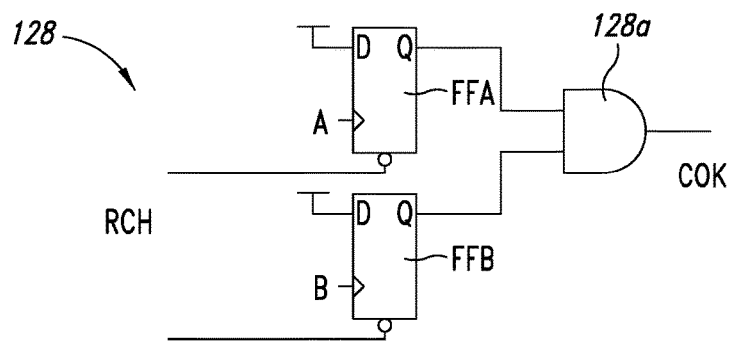
FIG. 7 shows schematically a detail of the second module of the circuit arrangement according to an embodiment.

In FIG. 7 is schematically detailed the datapath module 128 which comprises two flip-flops FFA and FFB clocked with the validation signals A and B respectively. When the reset check signal RCH arrives from the control module 127 on the reset input, both flip-flops FFA and FFB are cleared. As soon as a rising edge is detected on one of the validation signals A and B, the check ok signal COK, which is collected at the output of AND circuit 128a receiving the outputs of the flip-flops FFA and FFB as input, is set and is used by the control module 127 to determine if check has failed, as explained with reference to FIG. 6.

Thus, from the description here above example advantages of embodiments of the described solution are clear.

In an embodiment, the solution described employs two wires and has thus intrinsically a better coverage on the single stuck-at faults against a one wire solution.

A stuck-at-0 has a very low detection latency, while stuck-at-1 has a higher latency self-test. The solution described facilitates a fast recognition, e.g., low latency, of potentially fatal fault on main logic by always checking at the zero levels of the signals. Fatal fault could be power supply faults, unexpected reset conditions, etc. Coverage is completed with the stuck-at-1 self-test.

This in particular obtained by the described pattern of the validation signal with signal toggling and also since the validation signal generation circuit is implemented as asynchronous with respect to the standby clock, e.g., the clock of the second logic module, which performs error detection in the other module (e.g., main logic) generating signals to validate.

The solution described is independent from the second module clock, e.g., standby clock, frequency which is only useful to determine the period of the stuck-at-1 check. The main logic module can generate the validation signals at high frequency without affecting the behavior. This guarantees higher compatibility in case either standby or main logic shall be changed or updated with a new version.

Also, a reduced power consumption is obtained by maintaining the standby clock at low frequency.

Check operations cover both the missing of power supply of main logic, unexpected main logic reset or absence of main clock.

Of course, without prejudice to the principle of the disclosure, the details of construction and the embodiments may vary widely with respect to what has been described and illustrated herein purely by way of example, without thereby departing from the scope of the present disclosure.

The first and second logic modules may also be applied to any module in charge of error detection in another module generating signals to validate, where the block in charge of error detection has a clock slower than the block who generates the signals. For instance, it can be applied to a case where the second logic is any type of watchdog detecting errors in another logic module with faster clock.

According to one or more embodiments, a circuit arrangement for the validation of operation of a logic module in a multipower logic architecture is provided. Embodiments moreover concern a related method for the validation of operation of a logic module in a multipower logic architecture.

As mentioned in the foregoing, an embodiment of the present disclosure provides solutions regarding a circuit arrangement for validation of operation of a logic module in a multipower logic architecture, comprising:
at least a first logic module operating with a first clock signal and a first power supply, and
a second logic module operating with a second clock signal and second power supply, said second clock signal having a frequency lower than said first clock signal,
said first logic module and second logic module being configured to exchange signals at least on a communication link, wherein:
the first logic module is configured to generate a first validation signal and a second validation signal, in particular on a first and second wire respectively, which are sent over the communication link to the second logic module,
the second logic module being configured to:
perform a first check that the second validation signal is always logic one when the first validation signal is zero,
perform a second check that the first validation signal is always logic one when the second validation signal is zero, perform a cyclic check that the first validation signal and the second validation signal are not stuck-at-1, and to validate operation of the first logic module if said first check, second check and cyclic check give each a positive result.

In variant embodiments, the values of said first validation signal and second validation signal are never zero at the same time and a zero value in each of the first validation signal and second validation signal is preceded and followed by a logic one.

In variant embodiments, said first validation signal and second validation signal are periodic signal with the same period of four clock periods of length, in particular the first validation signal is '0111' the second validation signal is '1101.'

In variant embodiments, the first logic module comprises a validation signal generation module configured to generate said first validation signal and a second validation signal on a first and second wire respectively, which are sent over the link to the second logic.

In variant embodiments, said validation signal generation module comprises:
  at least one linear feedback shift register (comprising a number of cells, in particular flip-flops, equal to said number of clock periods, each cell being clocked by said first clock signal, the first validation signal and second validation signal being taken at outputs of cells of said at least one linear feedback shift register.

In variant embodiments, said at least one shift register comprises two shift registers, the first and second validation signals being taken at the output of the last cell of each register respectively.

In variant embodiments, said at least one linear feedback shift register comprises a single shift register the first validation signal and second validation signal being taken at the output of the last cell and at the output of one of the preceding cells, in particular the second, of said shift register.

In variant embodiments, said validation signal generation module comprises a logic output stage comprising two branches to which said first validation signal and second validation signal are respectively brought, said logic output stage being configured to issue the first validation signal and second validation signal upon reception of an enabling command.

In variant embodiments, such arrangement comprises an enable circuit issuing a signal enabling, upon reception of an enable signal, said output logic stage to issue the first and second validation signal upon reception of an enabling command, in particular said output logic stage comprising a pair of enabling logic circuits, in particular AND gates, each receiving at one of their input the first validation signal or the second validation signal respectively and the other the enabling command.

In variant embodiments, the second logic module comprises a checking module, receiving as input the first validation signal and second validation signal and configured to perform said first check, second check and cyclic check and to issue a corresponding check result signal, said logic module comprising a delay circuit, in particular a digital filter, clocked by the second clock signal, configured to delay the check result signal of one or more second clock signal cycles, and the first validation signal and second validation signal are sent to the input of a first latch and second latch, each latch receiving as clock signal the validation signal not received as input, the output of each latch (being supplied to a check logic circuit configured to implement said first check operation and second check operation by controlling that both the output of the first latch and of the second latch are one, in particular the output of each latch being coupled to a respective input of an AND performing logic circuit, the output of said first check logic circuit being coupled to a cyclic check circuit, in particular an AND logic circuit, which receives as input a fail flag signal, in particular negated, from a stuck at-1 checker, the output of which is coupled to a reset input of the delay circuit, in particular digital filter, which, upon activation, restarts to apply said one or more second clock signal cycles of delay to the check result signal.

In variant embodiments, the output of the cyclic check circuit is brought to a power check circuit performing an AND with a power on reset signal.

In variant embodiments, the stuck at-1 checker comprises a control module and a datapath module,
  said control module being configured to issue a reset check signal for a given number of clock cycles, then raising a fail flag signal or not depending on stuck at-1 check okay flag,
  the datapath module comprising two flip flops clocked by the first validation signal and second validation signal respectively and reset by the reset check signal, which outputs are compared and an okay check flag is raised if the outputs of the two flip flops are both raised, in particular logic one,
  said control block being configured, if said stuck at-1 check okay flag is raised to clear the fail flag and restart the reset check signal, else said fail flag is reset and the reset check signal restarted.

In variant embodiments, said first logic module is a main logic module powered by a main power supply, said second logic module is a standby logic configured to send a power up/power down signal to the main power supply to power up and power down said main logic module.

In variant embodiments, said second logic module is a watchdog module configured to detect errors in said first logic module which operates with a faster clock.

In embodiments, said first logic module is configured to generate a first validation signal and a second validation signal, in particular on a first and second wire respectively, which are sent over the communication link to the second logic module, the values of said first validation signal and second validation signal being never zero at the same time, said first validation signal and second validation signal B comprising each at least two bits. In further embodiments, said first validation signal and second validation signal comprise each at least three bits. In further embodiments, said first validation signal and second validation signal comprise each at least four bits.

The present disclosure provides also solutions regarding a method for validation of operation of a logic module in a multipower logic architecture, according to any of the embodiments wherein said method comprises:
  generating at the first logic module a first validation signal and a second validation signal, in particular on a first and second wire respectively, which are sent over the communication link to the second logic module,
  performing at the second logic:
    a first check that the second validation signal is always logic one when the first validation signal is zero,
    a second check that the first validation signal is always logic one when the second validation signal is zero,
    a cyclic check that the first validation signal and the second validation signal are not stuck-at-1, and validating signals issued from the first logic module if said first check, second check and cyclic check give each a positive result.

In variant embodiments, the values of said first validation signal and second validation signal are never zero at the same time and a zero value in each of the first validation signal and second validation signal is preceded and followed by a logic one.

In variant embodiments, said first validation signal and second validation signal are periodic signal with the same period of four clock periods of length, in particular the first validation signal being '0111,' the second validation signal being '1101.'

In an embodiment, a system comprises a first logic circuit having a first clock input and a first power input, a second logic circuit having a second clock input and a second power input, and a communication link communicatively coupling the first logic circuit and the second logic circuit. The first logic circuit, in operation, generates a first binary validation signal, a second binary validation signal, and one or more control signals, and transmits the first binary validation signal and the second binary validation signal to the second logic circuit via the communication link. The second logic circuit, in operation, validates the one or more control signals generated by the first logic circuit based on the first binary validation signal and the second binary validation signal. The validating the one or more control signals comprises: verifying that when the first binary validation signal has a first value, the second binary validation signal has a second value different from the first value; verifying that when the second binary validation signal has the first value, the first binary validation signal has the second value; verifying detection of a transition edge of the first binary validation signal within a threshold number of clock cycles; and verifying detection of a transition edge of the second binary validation signal within the threshold number of clock cycles.

In an embodiment, the first value is zero; the second value is one; the transition edge of the first binary validation signal is a rising edge; and the transition edge of the second binary validation signal is a rising edge. In an embodiment, the first clock input, in operation, receives a first clock signal; and the second clock input, in operation, receives a second clock signal different from the first clock signal. In an embodiment, the first binary validation signal is a periodic signal having a period of a number of clock cycles, wherein a clock cycle in which the first binary validation signal has a value of zero is proceeded by a clock cycle in which the first binary validation signal has a value of one and is followed by a clock cycle in which the first binary validation signal has a value of one; and the second binary validation signal is a periodic signal having a period of the number of clock cycles, wherein a clock cycle in which the second binary validation signal has a value of zero is proceeded by a clock cycle in which the second binary validation signal has a value of one and is followed by a clock cycle in which the second binary validation signal has a value of one. In an embodiment, the number of clock cycles of the period of the first binary validation signal is four. In an embodiment, in normal operation of the first logic circuit, when the first binary validation signal generated by the first logic circuit has a value of zero, the second binary validation signal generated by the first logic circuit has a value of one; and when the second binary validation signal generated by the first logic circuit has a value of zero, the first binary validation signal generated by the first logic circuit has a value of one.

In an embodiment, the first clock input, in operation, receives a first clock signal; the first binary validation signal is a periodic signal having a period of a number of clock cycles; the second binary validation signal is a periodic signal having a period of the number of clock cycles; and the first logic circuit comprises at least one linear feedback shift register having a number of cells equal to the number of clock cycles of the period of the first binary validation signal, the cells, in operation, being clocked by the first clock signal, the first validation signal and second validation signal, in operation, being generated at outputs of cells of the at least one linear feedback shift register. In an embodiment, the at least one linear feedback shift register comprises first and second linear feedback shift registers, the first binary validation signal, in operation, is generated at a last cell of the first linear feedback shift register and the second binary validation signal, in operation, is generated at a last cell of the second linear feedback shift register. In an embodiment, the at least one linear feedback shift register comprises a first linear feedback shift register, the first binary validation signal, in operation, is generated at a last cell of the first linear feedback shift register, and the second binary validation signal, in operation, is generated at another cell of the first linear feedback shift register, different from the last cell. In an embodiment, the first logic circuit, in operation, transmits the first binary validation signal and the second binary validation signal in response reception of an enable command.

In an embodiment, the first clock input, in operation, receives a first clock signal; the second clock input, in operation, receives a second clock signal different from the first clock signal; and the second logic circuit comprises: a first latch, which, in operation, receives the first binary validation signal as a data input, is clocked by the second binary validation signal, and generates a first latch output signal; a second latch, which, in operation, receives the second binary validation signal as a data input, is clocked by the first binary validation signal, and generates a second latch output signal; and a digital filter, which, in operation, is clocked by the second clock signal and validates the one or more control signals based on the first latch output signal and the second latch output signal. In an embodiment, the digital filter, in operation, validates the one or more control signals based on a signal indicative of whether one or more of the first binary validation signal and the second binary validation signal has a stuck fault. In an embodiment, digital filter, in operation, validates the one or more control signals based on a system reset signal. In an embodiment, the second logic circuit includes stuck fault detection circuitry which, in operation, generates the signal indicative of whether one or more of the first binary validation signal and the second binary validation signal has a stuck fault, the stuck fault detection circuitry having a data-path including: a first flip-flop which, in operation, is clocked by the first binary validation signal; and a second flip-flop which, in operation, is clocked by the second binary validation signal.

In an embodiment, the first clock input, in operation, receives a first clock signal; and the second clock input, in operation, receives a second clock signal having a frequency lower than a frequency of the first clock signal. In an embodiment, the second logic circuit, in operation, generates signals to control a power supply coupled to the power input of the first logic circuit. In an embodiment, the second logic circuit, in operation, detects errors in the operation of the first logic circuit.

In an embodiment, a method comprises: generating, using a first logic circuit, a first binary validation signal, a second binary validation signal, and one or more control signals; transmitting, by the first logic circuit via a communication link, the first binary validation signal and the second binary validation signal to a second logic circuit; and validating, by the second logic circuit, the one or more control signals generated by the first logic circuit based on the first binary validation signal and the second binary validation signal received via the communication link. The validating the one or more control signals comprises: verifying that when the first binary validation signal has a first value, the second binary validation signal has a second value different from the first value; verifying that when the second binary validation signal has the first value, the first binary validation signal has the second value; verifying detection of a transition edge of the first binary validation signal within a threshold number of clock cycles; and verifying detection of a transition edge of the second binary validation signal within the threshold number of clock cycles. In an embodiment, the first value is zero; the second value is one; the transition edge of the first binary validation signal is a rising edge; the transition edge of the second binary validation signal is a rising edge; and the method comprises driving the first logic circuit using a first clock and driving the second logic circuit using a second clock having a lower frequency than a frequency of the first clock. In an embodiment, the first binary validation signal is a periodic signal having a period of a number of clock cycles, wherein a clock cycle in which the first binary validation signal has a value of zero is proceeded by a clock cycle in which the first binary validation signal has a value of one and is followed by a clock cycle in which the first binary validation signal has a value of one; and the second binary validation signal is a periodic signal having a period of the number of clock cycles, wherein a clock cycle in which the second binary validation signal has a value of zero is proceeded by a clock cycle in which the second binary validation signal has a value of one and is followed by a clock cycle in which the second binary validation signal has a value of one. In an embodiment, in normal operation of the first logic circuit, when the first binary validation signal generated by the first logic circuit has a value of zero, the second binary validation signal generated by the first logic circuit has a value of one; and when the second binary validation signal generated by the first logic circuit has a value of zero, the first binary validation signal generated by the first logic circuit has a value of one. In an embodiment, the validating the one or more control signals comprises: latching the first binary validation signal in a first latch clocked by the second binary validation signal; latching the second binary validation signal in a second latch clocked by the first binary validation signal; and validating, using a digital filter clocked by the second clock, the one or more control signals based on an output of the first latch and an output of the second latch. In an embodiment, the validating comprises detecting a stuck fault in the first binary validation signal or the second binary validation signal.

In an embodiment, a device comprises an interface, which, in operation, receives a first periodic binary validation signal and a second periodic binary validation signal via a communication link, and logic circuitry coupled to the interface. The logic circuitry, in operation, validates one or more control signals based on the first periodic binary validation signal and the second periodic binary validation signal, wherein the validating the one or more control signals comprises: verifying the first periodic binary validation signal has a first value when the second periodic binary validation signal has a second value different from the first value; verifying the second periodic binary validation signal has the first value when the first periodic binary validation signal has the second value; verifying detection of a transition edge of the first periodic binary validation signal within a threshold number of clock cycles; and verifying detection of a transition edge of the second periodic binary validation signal within the threshold number of clock cycles. In an embodiment, the first value is one; the second value is zero; the transition edge of the first binary validation signal is a rising edge; and the transition edge of the second binary validation signal is a rising edge. In an embodiment, the logic circuitry comprises: a first latch, which, in operation, latches the first periodic binary validation signal and is clocked by the second periodic binary validation signal; a second latch, which, in operation, latches the second periodic binary validation signal and is clocked by the first periodic binary validation signal; a clock, which, in operation, generates a clock signal; and a digital filter clocked by the clock signal, wherein the digital filter, in operation, validates the one or more control signals based on an output of the first latch and an output of the second latch.

In an embodiment, a device comprises a communication interface; a clock, which, in operation, generates a clock signal; and logic circuitry coupled to the clock and to the communication interface. The logic circuitry, in operation, generates one or more control signals, generates a first periodic binary validation signal associated with the one or more control signals, and generates a second periodic binary validation signal associated with the one or more control signals. The logic circuitry transmits the first periodic binary validation signal and the second periodic binary validation signal via the interface. In a normal mode of operation, the first periodic binary validation signal has a first value when the second periodic binary validation signal has a second value different from the first value, and the second periodic binary validation signal has the first value when the first periodic binary validation signal has the second value. In an embodiment, the first value is one; and the second value is zero. In an embodiment, the logic circuitry comprises: a linear feedback shift register clocked by the clock signal and having a number of cells equal to a number of clock cycles of a period of the first periodic binary validation signal, wherein the first periodic binary validation signal is an output of a cell of the linear feedback shift register.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
a first logic circuit having a first clock input and a first power input;
a second logic circuit having a second clock input and a second power input; and
a communication link communicatively coupling the first logic circuit and the second logic circuit, wherein,
the first logic circuit, in operation:
generates a first binary validation signal, a second binary validation signal, and one or more control signals; and
transmits the first binary validation signal and the second binary validation signal to the second logic circuit via the communication link; and
the second logic circuit, in operation, validates the one or more control signals generated by the first logic circuit based on the first binary validation signal and the second binary validation signal, wherein the validating the one or more control signals comprises:
verifying that when the first binary validation signal has a first value, the second binary validation signal has a second value different from the first value;
verifying that when the second binary validation signal has the first value, the first binary validation signal has the second value;
verifying detection of a transition edge of the first binary validation signal within a threshold number of clock cycles; and
verifying detection of a transition edge of the second binary validation signal within the threshold number of clock cycles.

2. The system of claim 1, wherein,
the first value is zero;
the second value is one;
the transition edge of the first binary validation signal is a rising edge; and
the transition edge of the second binary validation signal is a rising edge.

3. The system of claim 2, wherein,
the first clock input, in operation, receives a first clock signal; and
the second clock input, in operation, receives a second clock signal different from the first clock signal.

4. The system according to claim 3, wherein,
the first binary validation signal is a periodic signal having a period of a number of clock cycles, wherein a clock cycle in which the first binary validation signal has a value of zero is proceeded by a clock cycle in which the first binary validation signal has a value of one and is followed by a clock cycle in which the first binary validation signal has a value of one; and
the second binary validation signal is a periodic signal having a period of the number of clock cycles, wherein a clock cycle in which the second binary validation signal has a value of zero is proceeded by a clock cycle in which the second binary validation signal has a value of one and is followed by a clock cycle in which the second binary validation signal has a value of one.

5. The system according to claim 4, wherein the number of clock cycles of the period of the first binary validation signal is four.

6. The system according to claim 2, wherein, in normal operation of the first logic circuit,
when the first binary validation signal generated by the first logic circuit has a value of zero, the second binary validation signal generated by the first logic circuit has a value of one; and
when the second binary validation signal generated by the first logic circuit has a value of zero, the first binary validation signal generated by the first logic circuit has a value of one.

7. The system according to claim 1, wherein,
the first clock input, in operation, receives a first clock signal;
the first binary validation signal is a periodic signal having a period of a number of clock cycles;
the second binary validation signal is a periodic signal having a period of the number of clock cycles; and
the first logic circuit comprises at least one linear feedback shift register having a number of cells equal to the number of clock cycles of the period of the first binary validation signal, the cells, in operation, being clocked by the first clock signal, the first validation signal and second validation signal, in operation, being generated at outputs of cells of the at least one linear feedback shift register.

8. The system according to claim 7, wherein the at least one linear feedback shift register comprises first and second linear feedback shift registers, the first binary validation signal, in operation, is generated at a last cell of the first linear feedback shift register and the second binary validation signal, in operation, is generated at a last cell of the second linear feedback shift register.

9. The system according to claim 7, wherein the at least one linear feedback shift register comprises a first linear feedback shift register, the first binary validation signal, in operation, is generated at a last cell of the first linear feedback shift register, and the second binary validation signal, in operation, is generated at another cell of the first linear feedback shift register, different from the last cell.

10. The system according to claim 7, wherein the first logic circuit, in operation, transmits the first binary validation signal and the second binary validation signal in response reception of an enable command.

11. The system according to claim 1, wherein,
the first clock input, in operation, receives a first clock signal;
the second clock input, in operation, receives a second clock signal different from the first clock signal; and
the second logic circuit comprises:
a first latch, which, in operation, receives the first binary validation signal as a data input, is clocked by the second binary validation signal, and generates a first latch output signal;
a second latch, which, in operation, receives the second binary validation signal as a data input, is clocked by the first binary validation signal, and generates a second latch output signal; and a digital filter, which, in operation, is clocked by the second clock signal and validates the one or more control signals based on the first latch output signal and the second latch output signal.

12. The system according to claim 11, wherein the digital filter, in operation, validates the one or more control signals based on a signal indicative of whether one or more of the first binary validation signal and the second binary validation signal has a stuck fault.

13. The system according to claim 12, wherein the digital filter, in operation, validates the one or more control signals based on a system reset signal.

14. The system of claim 12, wherein the second logic circuit includes stuck fault detection circuitry which, in operation, generates the signal indicative of whether one or more of the first binary validation signal and the second binary validation signal has a stuck fault, the stuck fault detection circuitry having a data-path including:

a first flip-flop which, in operation, is clocked by the first binary validation signal; and a second flip-flop which, in operation, is clocked by the second binary validation signal.

15. The system according to claim 1, wherein,
the first clock input, in operation, receives a first clock signal; and
the second clock input, in operation, receives a second clock signal having a frequency lower than a frequency of the first clock signal.

16. The system according to claim 1, wherein the second logic circuit, in operation, generates signals to control a power supply coupled to the power input of the first logic circuit.

17. The system according to claim 15, wherein the second logic circuit, in operation, detects errors in the operation of the first logic circuit.

18. A method, comprising:
generating, using a first logic circuit, a first binary validation signal, a second binary validation signal, and one or more control signals;
transmitting, by the first logic circuit via a communication link, the first binary validation signal and the second binary validation signal to a second logic circuit; and
validating, by the second logic circuit, the one or more control signals generated by the first logic circuit based on the first binary validation signal and the second binary validation signal received via the communication link, wherein the validating the one or more control signals comprises:
verifying that when the first binary validation signal has a first value, the second binary validation signal has a second value different from the first value;
verifying that when the second binary validation signal has the first value, the first binary validation signal has the second value;
verifying detection of a transition edge of the first binary validation signal within a threshold number of clock cycles; and
verifying detection of a transition edge of the second binary validation signal within the threshold number of clock cycles.

19. The method of claim 18, wherein,
the first value is zero;
the second value is one;
the transition edge of the first binary validation signal is a rising edge;

the transition edge of the second binary validation signal is a rising edge; and
the method comprises driving the first logic circuit using a first clock and driving the second logic circuit using a second clock having a lower frequency than a frequency of the first clock.

20. The method according to claim 19, wherein,
the first binary validation signal is a periodic signal having a period of a number of clock cycles, wherein a clock cycle in which the first binary validation signal has a value of zero is proceeded by a clock cycle in which the first binary validation signal has a value of one and is followed by a clock cycle in which the first binary validation signal has a value of one; and
the second binary validation signal is a periodic signal having a period of the number of clock cycles, wherein a clock cycle in which the second binary validation signal has a value of zero is proceeded by a clock cycle in which the second binary validation signal has a value of one and is followed by a clock cycle in which the second binary validation signal has a value of one.

21. The method according to claim 19, wherein, in normal operation of the first logic circuit,
when the first binary validation signal generated by the first logic circuit has a value of zero, the second binary validation signal generated by the first logic circuit has a value of one; and
when the second binary validation signal generated by the first logic circuit has a value of zero, the first binary validation signal generated by the first logic circuit has a value of one.

22. The method of claim 19, wherein the validating the one or more control signals comprises:
latching the first binary validation signal in a first latch clocked by the second binary validation signal;
latching the second binary validation signal in a second latch clocked by the first binary validation signal; and
validating, using a digital filter clocked by the second clock, the one or more control signals based on an output of the first latch and an output of the second latch.

23. The method according to claim 22, wherein the validating comprises detecting a stuck fault in the first binary validation signal or the second binary validation signal.

24. A device, comprising:
an interface, which, in operation, receives a first periodic binary validation signal and a second periodic binary validation signal via a communication link; and
logic circuitry coupled to the interface, wherein the logic circuitry, in operation, validates one or more control signals based on the first periodic binary validation signal and the second periodic binary validation signal, wherein the validating the one or more control signals comprises:
verifying the first periodic binary validation signal has a first value when the second periodic binary validation signal has a second value different from the first value;
verifying the second periodic binary validation signal has the first value when the first periodic binary validation signal has the second value;
verifying detection of a transition edge of the first periodic binary validation signal within a threshold number of clock cycles; and verifying detection of a transition edge of the second periodic binary validation signal within the threshold number of clock cycles.

25. The device of claim 24, wherein,
the first value is one;
the second value is zero;
the transition edge of the first binary validation signal is a rising edge; and
the transition edge of the second binary validation signal is a rising edge.

26. The device of claim 25, wherein the logic circuitry comprises:
a first latch, which, in operation, latches the first periodic binary validation signal and is clocked by the second periodic binary validation signal;
a second latch, which, in operation, latches the second periodic binary validation signal and is clocked by the first periodic binary validation signal;
a clock, which, in operation, generates a clock signal; and
a digital filter clocked by the clock signal, wherein the digital filter, in operation, validates the one or more control signals based on an output of the first latch and an output of the second latch.

27. A device, comprising:
a communication interface;
a clock, which, in operation, generates a clock signal; and
logic circuitry coupled to the clock and to the communication interface, wherein the logic circuitry, in operation:
generates one or more control signals;
generates a first periodic binary validation signal associated with the one or more control signals;
generates a second periodic binary validation signal associated with the one or more control signals; and
transmits the first periodic binary validation signal and the second periodic binary validation signal via the interface, wherein, in a normal mode of operation, the first periodic binary validation signal has a first value when the second periodic binary validation signal has a second value different from the first value, and the second periodic binary validation signal has the first value when the first periodic binary validation signal has the second value.

28. The device of claim 27, wherein,
the first value is one; and
the second value is zero.

29. The device of claim 27, wherein the logic circuitry comprises:
a linear feedback shift register clocked by the clock signal and having a number of cells equal to a number of clock cycles of a period of the first periodic binary validation signal, wherein the first periodic binary validation signal is an output of a cell of the linear feedback shift register.

* * * * *